(12) United States Patent
Fujita

(10) Patent No.: US 6,920,158 B2
(45) Date of Patent: Jul. 19, 2005

(54) OPTICAL MODULE

(75) Inventor: Takeshi Fujita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/319,539

(22) Filed: Dec. 16, 2002

(65) Prior Publication Data

US 2003/0123500 A1 Jul. 3, 2003

(30) Foreign Application Priority Data

Dec. 25, 2001 (JP) ........................................ 2001-390958
Oct. 2, 2002 (JP) ........................................ 2002-289612
Dec. 16, 2002 (JP) ........................................ 2002-363504

(51) Int. Cl.[7] .............................. H01S 3/30; G02B 6/40
(52) U.S. Cl. ........................................... 372/6; 385/88
(58) Field of Search ................ 372/6, 20, 29.01–29.32; 385/88

(56) References Cited

U.S. PATENT DOCUMENTS

| | | | | |
|---|---|---|---|---|
| 5,485,481 A | * | 1/1996 | Ventrudo et al. | 372/6 |
| 5,677,920 A | * | 10/1997 | Waarts et al. | 372/6 |
| 5,745,625 A | * | 4/1998 | Aikiyo et al. | 385/94 |
| 5,862,273 A | * | 1/1999 | Pelletier | 385/12 |
| 6,282,340 B1 | * | 8/2001 | Nasu et al. | 385/37 |
| 6,332,721 B1 | * | 12/2001 | Inokuchi | 385/93 |
| 6,400,736 B1 | * | 6/2002 | Aherne et al. | 372/6 |
| 6,519,386 B1 | * | 2/2003 | Vakhshoori et al. | 385/31 |
| 6,522,673 B1 | * | 2/2003 | Williamson et al. | 372/29.021 |
| 6,524,016 B1 | * | 2/2003 | Ohki et al. | 385/88 |
| 6,567,447 B1 | * | 5/2003 | Yoshida et al. | 372/49 |
| 6,647,038 B2 | * | 11/2003 | Althaus et al. | 372/36 |
| 6,665,323 B2 | * | 12/2003 | Fujita | 372/32 |
| 6,707,072 B2 | * | 3/2004 | Ohkubo et al. | 257/98 |
| 6,792,008 B2 | * | 9/2004 | Wolak et al. | 372/6 |
| 2002/0080833 A1 | * | 6/2002 | Matsurra et al. | 372/20 |
| 2002/0085596 A1 | * | 7/2002 | Irie et al. | 372/36 |
| 2002/0093738 A1 | * | 7/2002 | Kimura et al. | 359/497 |
| 2002/0118715 A1 | * | 8/2002 | Kimura et al. | 372/36 |

FOREIGN PATENT DOCUMENTS

| | | |
|---|---|---|
| JP | 2000-171671 | 6/2000 |
| JP | 2001-85785 | 3/2001 |

* cited by examiner

Primary Examiner—Minsun Oh Harvey
Assistant Examiner—Philip Nguyen
(74) Attorney, Agent, or Firm—Burns, Doane, Swecker & Mathis, LLP

(57) ABSTRACT

An optical fiber that transmits laser beams generated by a laser diode in an optical module is provided with a fiber grating. The fiber grating passes most of the laser beams and reflects some of them to a photodiode provided on the back side of the laser diode. The photodiode also receives scattered laser beams from the laser diode. The photodiode outputs a current equivalent to the amount of received laser beams. An APC circuit controls emission of laser beams by the laser diode based on this current.

13 Claims, 4 Drawing Sheets

OPTICAL MODULE

BACKGROUND OF THE INVENTION

1) Field of the Invention

The present invention relates to an optical module that has an optical fiber and a laser diode optically coupled together, and includes a monitoring photodiode that receives a beam emitted from the back side of the laser diode.

2) Description of the Related Art

In the optical communications, an optical fiber amplifier, which employs an EDF (Er-doped optical fiber), is used for amplifying the optical signal transmitted through the optical fiber. This optical fiber amplifier has an optical module as a light source and, amplifies the light generated by the optical module. FIG. 7 shows a structure of a conventional optical module 100. A reference numeral 1 denotes a laser diode (LD) that emits a laser beam from the front side (front laser beam) and the back side (back laser beam) thereof, and 2 denotes a lens that focuses the front laser beam. A reference numeral 3 denotes an optical fiber that transmits the laser beam focused by the lens 2, and 4 denotes a monitoring photodiode (PD) that receives the back laser beam and outputs a current proportional to the received laser beam. A reference numeral 50 denotes an output terminal-from where the current (monitoring current) of the photodiode 4 is output to the outside. A reference numeral 5 denotes an APC (Automatic Power Control) circuit that controls the output of the laser diode 1 according to the monitoring current and, it is a part of a not shown optical transmitter.

The conventional optical module 100 operates as follows. The laser diode 1 emits the front laser beam and the back laser beam. The lens 2 focuses the front laser beam. The optical fiber 3 transmits the laser beam focused by the lens 2 to the outside. The back laser beam falls on the photodiode 4. The photodiode 4 outputs the monitoring current. The APC circuit 5 receives the monitoring current via the output terminal 50. The APC circuit 5 adjusts or controls the power provided to the laser diode 1 based on the monitoring current.

One of the causes of the tracking error is the deviation of the optical axis (optical axis deviation). To transmit the laser beam effectively, it is necessary that the laser beam from the lens 2 falls at the center of the core of the optical fiber 3. The optical axis deviation is a positional difference between the focal point of the lens 2 and the point (beam input point) on the end surface of the optical fiber 3 where the laser beam focused by the lens 2 falls. The optical axis deviation may occur due to, for example, a change in the temperature inside the optical module 100. The optical axis deviation lowers the quantity of the beam incident to the optical fiber, which results in a reduction in the beam output to the end surface of the optical fiber. This reduced quantity of the output beam becomes a factor of the tracking error. The tracking error causes a variation in the gain of the optical fiber amplifier, and this becomes a serious problem in the optical communications.

FIG. 8 shows a relationship between the monitoring current and the output of the optical fiber 3 (fiber-end beam output). When the monitoring current is 0.155 mA, the output at 5° C. is 109.5 mW, and the output at 45° C. is 96.5 mW. Therefore, the tracking error of −0.55 dB (=10×LOG (96.5/109.5)) occurs.

FIG. 9 shows relationships between the output and the optical axis deviation (dotted line) and, between the monitoring current and the optical axis deviation (continuous line). The output is considerably lower when there is the optical axis deviation, however, the monitoring current is not much affected by the optical axis deviation. This is because the back laser beam becomes a scattering beam because there is no lens between the laser diode 1 and the photodiode 4. On the other hand, the front laser beam is focused by the lens 2. Even if the optical axis deviation is small, of the order of micrometers, the laser beam is not focused at the center of the optical fiber 3 and therefore, the output is lowered.

Thus, in the conventional optical module, the monitoring current is output from a scattered laser beam that is not much affected by the temperature. Since the APC circuit performs the power control based on such monitoring current, there is a problem that the tracking error becomes large.

SUMMARY OF THE INVENTION

It is an object of this invention to provide an optical module capable of suppressing the tracking error.

The optical fiber according to one aspect of the present invention comprises a laser diode that emits a front laser beam towards a front side thereof and back laser beam towards a back side thereof; a lens that focuses the front laser beam; a feedback unit that reflects a part of the front laser beam that is focused by the lens, and passes or absorbs the rest of the front laser beam; an optical fiber that transmits the front laser beam passed by the feedback unit; and a photodiode that receives the back laser beam and outputs a current proportional to the amount of the back laser beam.

The optical fiber according to another aspect of the present invention is the optical module in which a change in a monitoring current of a monitoring photodiode corresponding to a deviation of a lens focusing point from a beam input point to an optical fiber end surface is the same as the direction of a change (reduction) in a beam output to the front surface of a laser diode relative to the deviation, and a variation (relative value) relative to the deviation is at least one sixth of a variation (relative value) of the beam output to the front surface.

These and other objects, features and advantages of the present invention are specifically set forth in or will become apparent from the following detailed descriptions of the invention when read in conjunction with the accompanying drawings.

DETAILED DESCRIPTIONS

Figure 1:
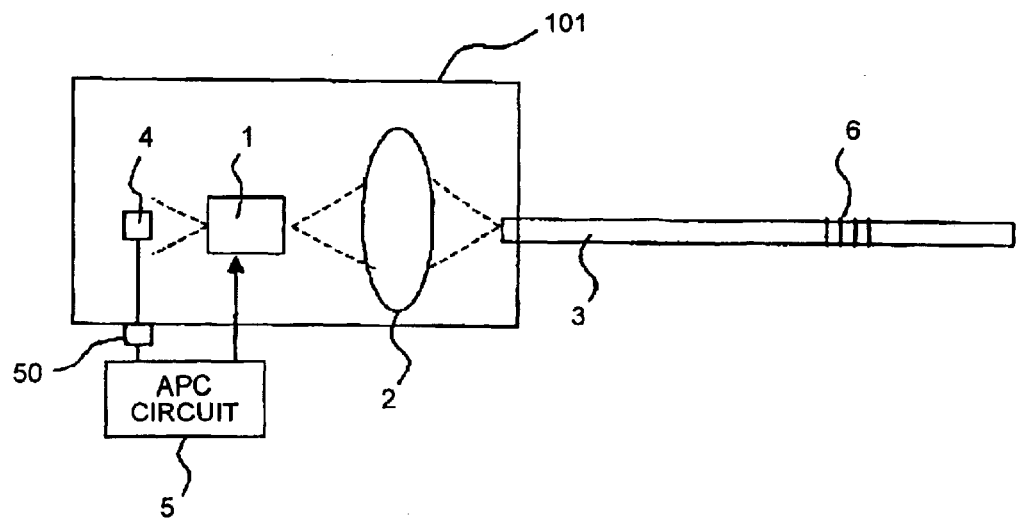
FIG. 1 is a diagram that shows a structure of an optical module relating to an embodiment of the present invention.

FIG. 1 is a diagram that shows a structure of an optical module 101 relating to an embodiment of the present invention. In FIG. 1, reference numerals 1 to 5, and 50 denote constituent parts of the optical module identical to those of the conventional technique. A reference numeral 6 denotes a fiber grating that has a diffraction grating provided in the optical fiber 3 and is used as a feedback section that reflects a part of a beam and passes or absorbs the rest of the beam.

The operation of the optical module 101 is explained below. The laser diode 1 emits the front laser beam. The lens 2 focuses the first laser beam. The optical fiber 3 transmits the focused beam. The fiber grating 6 reflects a part of the beam incident to the optical fiber, and passes the rest of the beam. The reflected part of the laser beam is passes through the lens 2 and the laser diode 1 and, falls on the photodiode 4. When the fiber-end beam output changes due to a deviation of the optical axis, the quantity of the beam reflected by the fiber grating 6 changes. Consequently, the amount of the laser beam that reaches the photodiode 4 changes. The optical axis deviation refers to a positional difference between a focusing position of the lens 2 and a beam input point on the end surface of the optical fiber 3.

Figure 2:
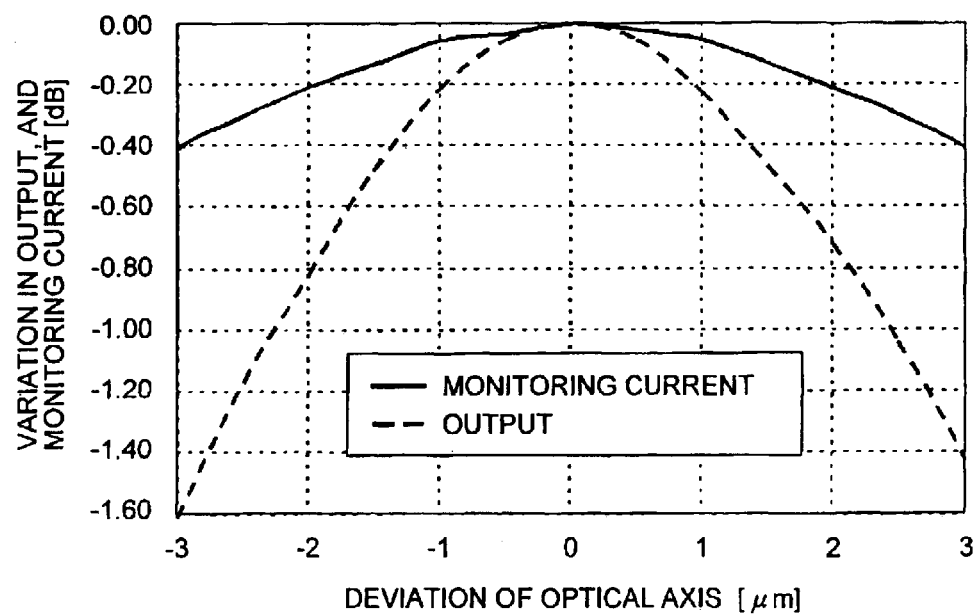
FIG. 2 is a graph that shows a result of measuring a variation in an output and monitoring current, versus an optical axis deviation, in the structure according to the embodiment.

FIG. 2 shows a relationship between output and the monitoring current, versus the optical axis deviation, in the optical module 101. A fiber grating of reflectance of about 3% is used as the fiber grating 6. As shown in FIG. 2, when the optical axis deviation occurs, the output is lowered, and the monitoring current is also lowered. The reduction in the output due to the optical axis deviation changes in a quadratic curve based on a relationship between a focusing pattern of the laser diode emission beam and a mode field diameter of an optical fiber. The reduction in the monitoring current due to the optical axis deviation is mainly attributable to a reduction in the proportion of the reflection beam from the fiber grating. This change depends on the reflectance of the fiber grating and the installation position of the monitoring photodiode. As explained above, when the optical axis deviation occurs, the monitoring output current is also reduced along a reduction in the fiber-end beam output. Therefore, at the time of carrying out the beam output control based on the APC circuit 5, the operation current of the laser diode 1 is increased in order to make the monitoring current constant. As a result, the output of the laser diode 1 is increased to suppress the tracking error, thereby to stabilize the output.

Figure 3:
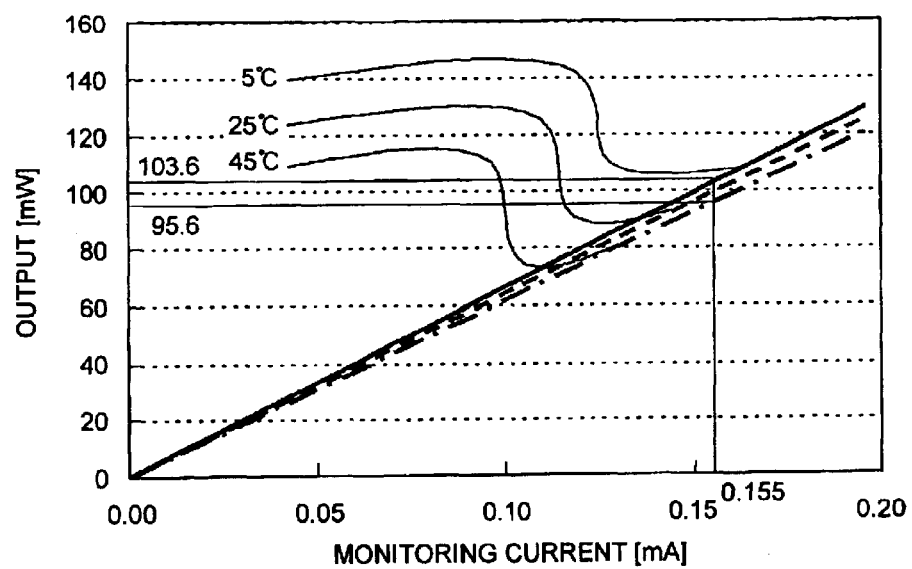
FIG. 3 is a graph that shows a result of measuring a relationship between a monitoring current of a photodiode and the output, in the structure according to the embodiment.

FIG. 3 shows a relationship between a monitoring current of the photodiode 4 and an output of a beam transmitted through the optical fiber 3 (fiber-end beam output), when the fiber grating of a reflectance of about 3% is used. When the monitoring current is 0.155 mA, the fiber-end beam output at 5° C. is 103.6 mW, and the fiber-end beam output at 45° C. is 95.6 mW. Therefore, the tracking error that occurs due to the difference of temperatures between 5° C. and 45° C. is −0.35 dB (=10×LOG (95.6/103.6)). As explained above, according to the present embodiment, when the fiber grating (reflectance: about 3%) is used, it is possible to suppress the tracking error by about 0.2 dB as compared with the conventional technique.

It is preferable that the reflectance of the fiber grating 6 is between 2% and 10% due to the reasons explained below.

When the reflectance is larger, the rate of a reduction in the monitoring current due to the optical axis deviation becomes larger. Although this appears that a larger effect of improvement in suppressing the tracking error is obtained, this lowers the fiber-end beam output corresponding to this increased reflectance.

It is possible to output only a beam of a desired wavelength, by optionally selecting the wavelength range of mainly the beam reflected from the fiber grating.

Figure 4:
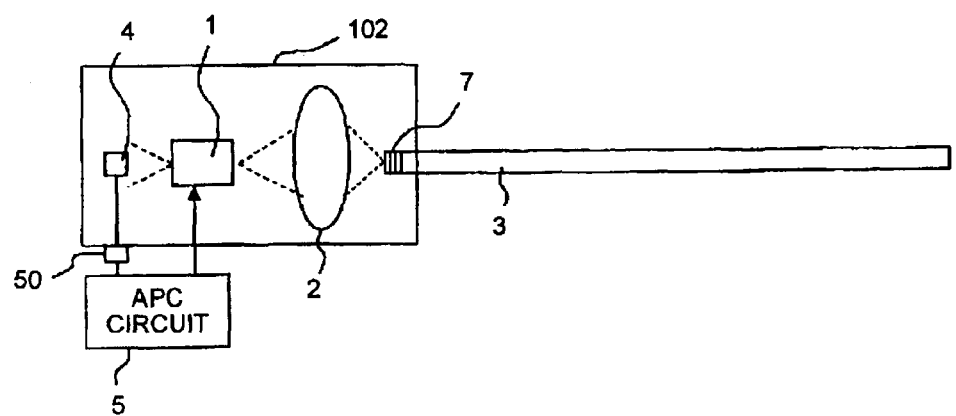
FIG. 4 is a diagram that shows a variation of the present embodiment in which a feedback section is provided on the end surface of an optical fiber.

FIG. 4 shows an example of a structure of an optical module 102 in which a feedback section 7 is provided on the end surface of the optical fiber 3. A reference numeral 7 denotes a feedback section that reflects a part of a beam and passes or absorbs the rest of the beam. It is possible to realize this feedback section, by providing a coating that has characteristics of reflecting a part of a beam and passing or absorbing the rest of the beam, on the end surface of the optical fiber.

Figure 5:
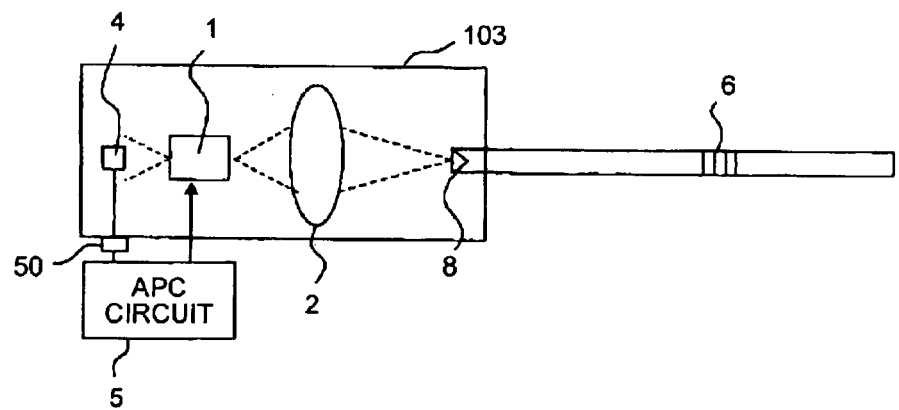
FIG. 5 is a diagram that shows a variation of the present embodiment in which an expanded core fiber is used.

As another modification of the embodiment, an optical module 103 according to the present invention uses an extended core fiber 8 (i.e., expanded core fiber) as shown in FIG. 5, in addition to the structure described above. Based on the use of the extended core fiber, it is possible to relax the tolerance of optical axis deviation, and this is advantageous when the optical axis deviation occurs due to a change in the temperature. Further, it is also possible to improve the productivity.

Figure 6:
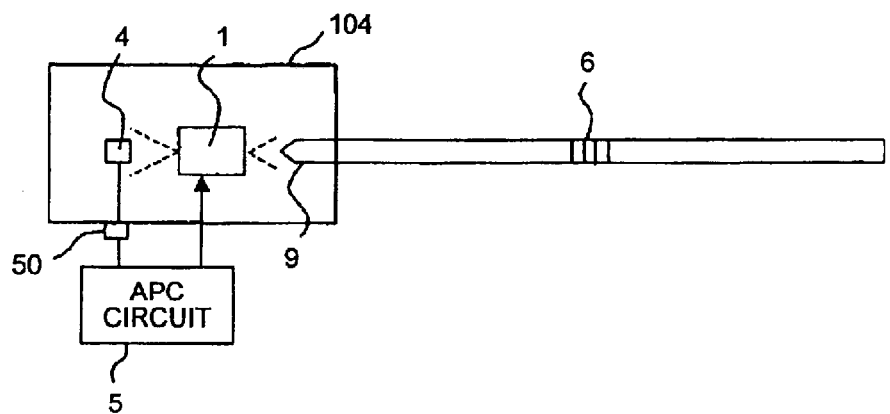
FIG. 6 is a diagram that shows a variation of the present embodiment in which a wedge type fiber is used.
Figure 7:
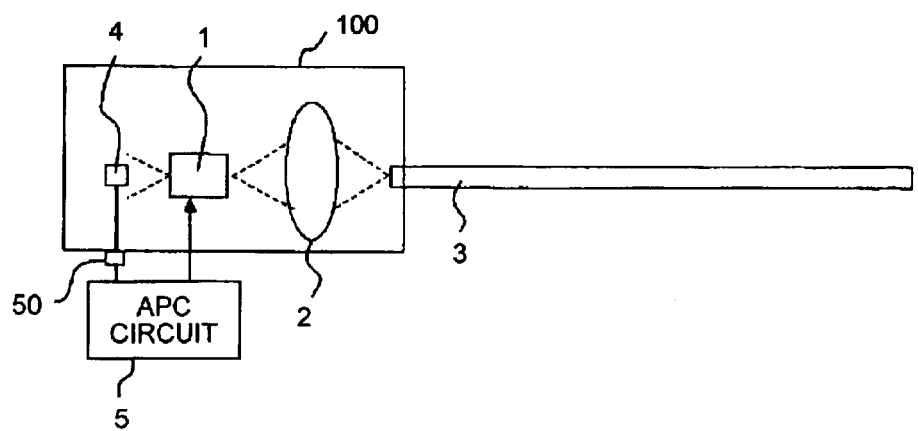
FIG. 7 is a diagram that shows a structure of a conventional optical module.
Figure 8:
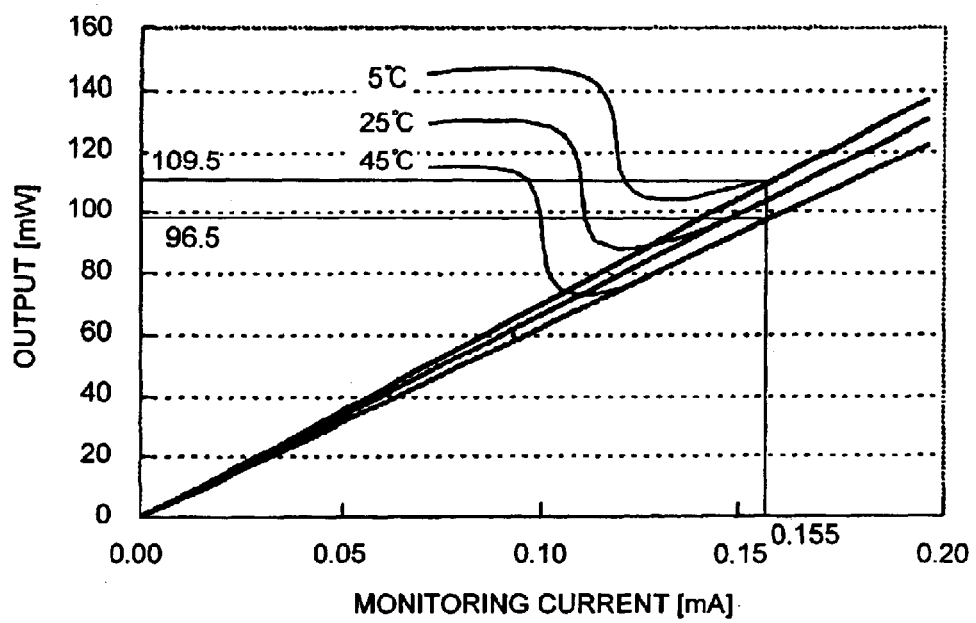
FIG. 8 is a graph that shows a result of measuring a relationship between a monitoring current of a photodiode and an output, in a conventional structure.
Figure 9:
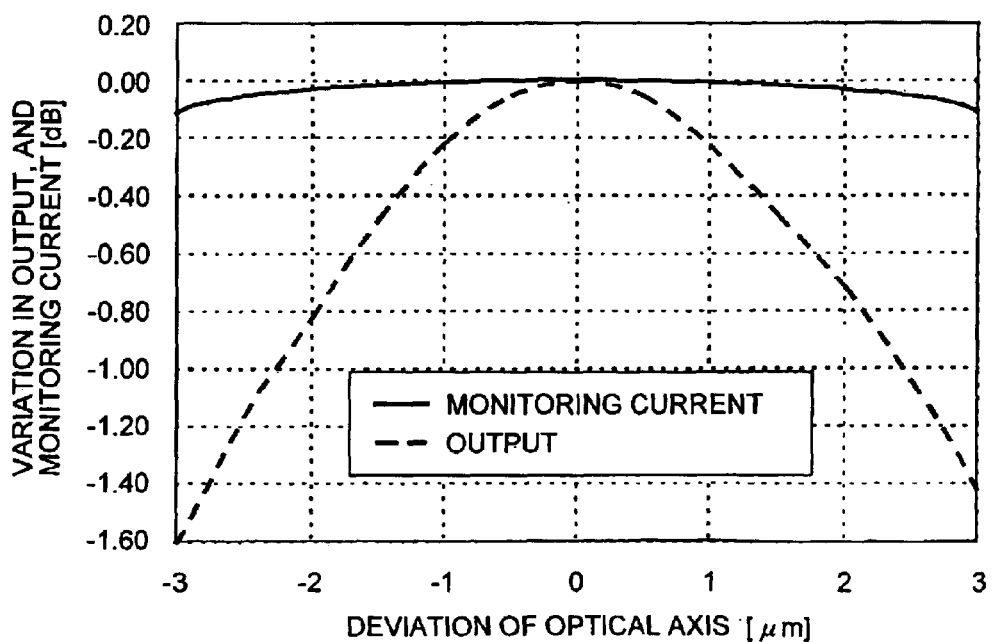
FIG. 9 is a graph that shows a result of measuring a variation in an output and a monitoring current, versus an optical axis deviation, in the conventional structure.

As another modification of the embodiment, an optical module 104 according to the present invention is provided with a wedge type fiber 9 formed by processing the front end of an optical fiber in a wedge shape as shown in FIG. 6. With this wedge type fiber, it is possible to improve the coupling efficiency when a laser diode having an oval emission beam is used. It is also possible to omit the lens 2. Therefore, it is possible to expect a reduction in the cost based on a reduced number of parts used.

As explained above, according to the present invention, it is possible to provide an optical module capable of suppressing the occurrence of a tracking error due to an optical axis deviation or the like, by using a feedback section that detects a reduction in the beam output to the fiber end attributable to the optical axis deviation or the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical module comprising:
   a laser diode that emits a front laser beam towards a front side thereof and back laser beam towards a back side thereof;
   a lens that focuses the front laser beam;
   a feedback unit that reflects a part of the front laser beam that is focused by the lens, and passes or absorbs the rest of the front laser beam;
   an optical fiber that transmits the front laser beam passed by the feedback unit; and
   a photodiode that receives the back laser beam and outputs a current proportional to the amount of the back laser beam,
   wherein the feedback unit comprises a coating provided on an end surface of the optical fiber, wherein:
   a deviation of a focusing point of the laser beam input to an end surface of the optical fiber causes a relative chance in an amount of the laser beam coupled to an end surface optical fiber and causes a relative change in the current of the photodiode, and the relative change in the current of the photodiode resulting from the deviation is at least one sixth of the relative change in the amount of the laser beam coupled to the end surface optical fiber resulting from the deviation.

2. The optical module according to claim 1, further comprising an output terminal from where the current generated in the photodiode is output to the outside.

3. The optical module according to claim 2, further comprising an automatic power control circuit that controls a power of the laser beams output by the laser diode based on the current output from the output terminal.

4. The optical module according to claim 1, wherein the reflectance of the coating is between 2% and 10%.

5. The optical module according to claim 1, wherein the optical fiber is an expanded core fiber.

6. The optical module according to claim 1, wherein the optical fiber is a wedge type fiber.

7. The optical module according claim 1, wherein the coating provides feedback by reflecting said part of the front laser beam focused by the lens back into the laser diode, thereby enabling monitoring of changes in the current of the photodiode resulting from positional changes of a focusing point of the laser beam input to an end surface of the optical fiber.

8. An optical module comprising:

a laser diode;

a photodiode that receives light from the laser diode; and an optical fiber that receives a laser beam from the laser diode, wherein the photodiode is configured to be coupled to an automatic power control circuit and to generate a monitoring current corresponding to the light received from the laser diode, a relative change in the monitoring current of the photodiode resulting from a deviation of a focusing point of the laser beam input to an end surface of the optical fiber has the same direction as a relative change in an amount of the laser beam coupled to the end surface optical fiber resulting from the deviation, and the relative change in the monitoring current resulting from the deviation is at least one sixth of the relative change in the amount of the laser beam coupled to the end surface optical fiber resulting from the deviation.

9. The optical module according to claim 8, wherein the optical fiber is an expanded core fiber.

10. The optical module according to claim 8, wherein the optical fiber is a wedge type fiber.

11. The optical module as claimed in claim 8, wherein the optical fiber includes a feedback unit.

12. The optical module as claimed in claim 8, wherein the feedback unit comprises one of a grating and a reflective coating.

13. The optical module according to claim 12, wherein reflectance of the coating is between 2% and 10%.

* * * * *